(12) United States Patent
Saarela et al.

(10) Patent No.: US 8,977,377 B2
(45) Date of Patent: Mar. 10, 2015

(54) METHOD FOR DIGITAL MANUFACTURING OF JEWELRY ITEMS

(75) Inventors: Tim Saarela, Prior Lake, MN (US); Kevin Abernathy, Burnsville, MN (US); Richard Wells, St. Louis Park, MN (US); Lev Neyman, Maple Grove, MN (US); Jon Joriman, Little Canada, MN (US)

(73) Assignee: Jostens, Inc., Minneapolis, MN (US)

( * ) Notice: Subject to any disclaimer, the term of this patent is extended or adjusted under 35 U.S.C. 154(b) by 36 days.

(21) Appl. No.: 13/035,742

(22) Filed: Feb. 25, 2011

(65) Prior Publication Data

US 2011/0213482 A1    Sep. 1, 2011

Related U.S. Application Data

(60) Provisional application No. 61/308,245, filed on Feb. 25, 2010.

(51) Int. Cl.
| | |
|---|---|
| *G05B 19/18* | (2006.01) |
| *G06F 19/00* | (2011.01) |
| *B22C 7/00* | (2006.01) |
| *B22D 11/00* | (2006.01) |
| *A44C 27/00* | (2006.01) |
| *G06F 17/50* | (2006.01) |
| *B22C 7/02* | (2006.01) |

(Continued)

(52) U.S. Cl.
CPC . *B22C 7/02* (2013.01); *A44C 27/00* (2013.01); *G06Q 10/06* (2013.01); *G06T 19/00* (2013.01)
USPC ............... 700/98; 700/61; 700/118; 700/131; 164/235; 164/271; 29/896.411; 703/1

(58) Field of Classification Search
USPC ............. 700/61, 98, 118, 119, 120, 131, 146, 700/182, 197; 164/235, 271, 436, 295; 29/896.411, 896.412, 888.047, 29/890.127; 705/1, 26.1; 703/1
See application file for complete search history.

(56) References Cited

U.S. PATENT DOCUMENTS 2,858,897 A    11/1958  Kraemer
3,964,915 A *  6/1976  Doenges et al. ............. 106/38.6

(Continued)

FOREIGN PATENT DOCUMENTS

| FR | 2536969 | 6/1984 |
| FR | 2829366 | 3/2003 |

(Continued)

OTHER PUBLICATIONS

Wannarumon et al. "Rapid Prototyping and Tooling Technology in Jewelry CAD", Computer-Aided Design and Applications, Jan. 2004, vol. 1, No. 1-4 (pp. 569-575).

(Continued)

*Primary Examiner* — Darrin Dunn
(74) *Attorney, Agent, or Firm* — Winthrop & Weinstine, P.A.

(57) ABSTRACT

In various embodiments, digital manufacturing of jewelry items is provided, including a physical process and software automation for implementing the physical process. Further, models formed during the process, as well as the resultant jewelry items, are provided. In some embodiments, the method comprises forming a digital model of the jewelry item, forming a physical model of the jewelry item based on the digital model, and manufacturing the jewelry item in a lost wax process using the physical model.

11 Claims, 11 Drawing Sheets

(51) Int. Cl.
*G06Q 10/06* (2012.01)
*G06T 19/00* (2011.01)

(56) References Cited

U.S. PATENT DOCUMENTS

| | | | |
|---|---|---|---|
| 4,004,333 A | 1/1977 | Daniels | |
| 4,561,061 A | 12/1985 | Sakamoto et al. | |
| 4,630,309 A | 12/1986 | Karow | |
| 4,761,865 A | 8/1988 | Magien | |
| 4,771,474 A | 9/1988 | Takashima et al. | |
| 4,918,611 A | 4/1990 | Shyu et al. | |
| 4,969,201 A | 11/1990 | Takasaki et al. | |
| 4,972,323 A | 11/1990 | Cauwet | |
| 5,003,498 A | 3/1991 | Ota et al. | |
| 5,007,098 A | 4/1991 | Kumagai | |
| 5,116,174 A | 5/1992 | Fried et al. | |
| 5,249,670 A | 10/1993 | Simon | |
| 5,261,768 A | 11/1993 | Loucks et al. | |
| 5,329,381 A | 7/1994 | Payne | |
| 5,369,736 A | 11/1994 | Kato et al. | |
| 5,377,506 A | 1/1995 | Tranzer | |
| 5,473,742 A | 12/1995 | Polyakov et al. | |
| 5,532,933 A | 7/1996 | Nakata | |
| 5,544,291 A | 8/1996 | Gilley et al. | |
| 5,548,698 A | 8/1996 | Smith et al. | |
| 5,569,003 A | 10/1996 | Goldman et al. | |
| 5,587,913 A | 12/1996 | Abrams et al. | |
| 5,649,079 A | 7/1997 | Holmes | |
| 5,668,930 A | 9/1997 | Hamura et al. | |
| 5,689,577 A | 11/1997 | Arata | |
| 5,739,822 A * | 4/1998 | Paradine | 345/419 |
| 5,739,912 A | 4/1998 | Ishii | |
| 5,790,713 A | 8/1998 | Kamada et al. | |
| 5,850,222 A | 12/1998 | Cone | |
| 5,926,388 A | 7/1999 | Kimbrough et al. | |
| 5,926,389 A | 7/1999 | Trounson | |
| 5,968,564 A | 10/1999 | Welsh et al. | |
| 5,977,007 A * | 11/1999 | Lassow et al. | 501/152 |
| 6,003,228 A | 12/1999 | Riggio | |
| 6,083,267 A | 7/2000 | Motomiya et al. | |
| 6,085,126 A | 7/2000 | Mellgren, III et al. | |
| 6,101,280 A | 8/2000 | Reynolds | |
| 6,124,858 A | 9/2000 | Ge et al. | |
| 6,138,055 A | 10/2000 | Pryor | |
| 6,181,839 B1 | 1/2001 | Kannon et al. | |
| 6,249,289 B1 | 6/2001 | Arnaud et al. | |
| 6,260,383 B1 | 7/2001 | Warren et al. | |
| 6,300,595 B1 | 10/2001 | Williams | |
| 6,349,758 B1 * | 2/2002 | Bell | 164/235 |
| 6,407,361 B1 | 6/2002 | Williams | |
| 6,434,277 B1 | 8/2002 | Yamada et al. | |
| 6,546,305 B1 | 4/2003 | Hruby | |
| 6,568,455 B2 * | 5/2003 | Zieverink | 164/4.1 |
| 6,600,488 B1 | 7/2003 | Moreton et al. | |
| 6,628,279 B1 | 9/2003 | Schell et al. | |
| 6,763,279 B2 | 7/2004 | Davis | |
| 6,856,314 B2 | 2/2005 | Ng | |
| 6,877,916 B2 | 4/2005 | Khaikin | |
| 6,978,230 B1 | 12/2005 | Klosowski et al. | |
| 6,982,710 B2 | 1/2006 | Salomie | |
| 7,003,371 B2 | 2/2006 | Tsuchida et al. | |
| 7,006,089 B2 | 2/2006 | Baumberg | |
| 7,069,108 B2 * | 6/2006 | Saarela et al. | 700/193 |
| 7,091,963 B2 | 8/2006 | Dreservic et al. | |
| 7,236,180 B2 | 6/2007 | Dreservic et al. | |
| 7,593,786 B2 | 9/2009 | Saarela et al. | |
| 7,747,055 B1 | 6/2010 | Vining et al. | |
| 7,856,285 B2 | 12/2010 | Carbonera et al. | |
| 8,085,266 B2 | 12/2011 | Carbonera et al. | |
| 8,126,683 B2 | 2/2012 | Carbonera et al. | |
| 2001/0044668 A1 | 11/2001 | Kimbrough et al. | |
| 2002/0063912 A1 | 5/2002 | Barbanell | |
| 2002/0085748 A1 | 7/2002 | Baumberg | |
| 2002/0092322 A1 | 7/2002 | Zieverink | |
| 2002/0113865 A1 | 8/2002 | Yano et al. | |
| 2002/0128742 A1 | 9/2002 | Zieverink | |
| 2002/0154122 A1 | 10/2002 | Di Lelle | |
| 2002/0159638 A1 | 10/2002 | Ratner et al. | |
| 2002/0181802 A1 | 12/2002 | Peterson | |
| 2002/0191863 A1 | 12/2002 | Biermann et al. | |
| 2004/0091143 A1 | 5/2004 | Hu | |
| 2004/0111178 A1 | 6/2004 | Saarela et al. | |
| 2004/0237822 A1 * | 12/2004 | Boland et al. | 101/483 |
| 2005/0089237 A1 | 4/2005 | Park et al. | |
| 2005/0147312 A1 | 7/2005 | Chen | |
| 2005/0149409 A1 * | 7/2005 | Whaley | 705/26 |
| 2005/0160574 A1 | 7/2005 | Bazin et al. | |
| 2005/0222862 A1 | 10/2005 | Guhde et al. | |
| 2006/0001664 A1 | 1/2006 | Carbonera | |
| 2006/0200269 A1 | 9/2006 | Saarela et al. | |
| 2006/0217037 A1 | 9/2006 | Kalanovic | |
| 2006/0290695 A1 | 12/2006 | Salomie | |
| 2008/0040080 A1 * | 2/2008 | Bae et al. | 703/1 |
| 2008/0177410 A1 | 7/2008 | Carbonera | |
| 2008/0229784 A1 | 9/2008 | Carbonera et al. | |
| 2009/0056373 A1 * | 3/2009 | Czajka et al. | 63/3 |
| 2009/0060393 A1 * | 3/2009 | Satoh | 382/305 |
| 2009/0263624 A1 * | 10/2009 | Illston | 428/131 |
| 2010/0169059 A1 * | 7/2010 | Thomas-Lepore et al. | 703/1 |
| 2011/0144785 A1 | 6/2011 | Carbonera et al. | |
| 2011/0213482 A1 | 9/2011 | Saarela et al. | |
| 2012/0075297 A1 | 3/2012 | Carbonera et al. | |
| 2012/0116729 A1 | 5/2012 | Carbonera et al. | |

FOREIGN PATENT DOCUMENTS

| | | |
|---|---|---|
| FR | 2880521 | 7/2006 |
| JP | 2003150666 | 5/2003 |
| WO | 0057254 | 8/2000 |
| WO | 0193156 | 12/2001 |
| WO | 2004053653 | 6/2004 |

OTHER PUBLICATIONS

"2004 Your Guide to feature-based Manufacturing", Jun. 2003, Engineering Geometry Systems, Tenth Edition, pp. 13-66, 153-182, 291-298, 311-342, 369, 380, 441-457.

Patent Abstracts of Japan, vol. 2003, No. 9, Sep. 3, 2003.

International Search Report for PCT Application No. PCT/US2005/013469, mailed Sep. 6, 2005.

Sigmund et al. "Transformations between Pictures from 2D to 3D", Jun. 2000, Journal of Intelligent and Robotic Systems, vol. 28, pp. 69-84.

Hendricks, Bob. "Henricks Mfg. Jewellers—CNC Production of Wax Models Boosts Ring Sales by 50%", www.techno-isel.com/CNC_Routers/Testimonials/Articles/Hendricks.htm, Nov. 25, 2001.

Wick et al. "Tool and Manufacturing Engineers Handbook", 1998, Society of Manufacturing Engineers, vol. 3, Chapter 15, pp. 15-1, 15-2, and 15-25.

Wirth, Joachim "Rapid Modeling", Carl Hanser Verlag, Munchen, 2002, pp. 60-62, 170-177.

International Search Report and Written Opinion. International Patent Application No. PCT/US2008/056705. Mailed Apr. 8, 2008.

Techjewel, "TechGems 3.0", User Guide, 2004.

Stamati et al. "A Parametric Feature-based CAD System for Reproducing Traditional Pierced Jewellery", Computer-Aided Design, vol. 37, Issue 4, pp. 431-449, Apr. 2005.

Wannarumon et al. "Intelligent Computer System for Jewelry Design Support", Computer Aided Design and Applications, 1 (1-4) 551-558, 2004.

Rowan, Mark, "Automated Methods for Evolutionary Pave Jewellery Design", The University of Birmingham School of Computer Science, Jan. 15, 2006.

Delcam plc, "ArtCAM JewelSmith User Guide", Issue 7.1 Sep. 11, 2004.

Park, Sang C. "Polygonal extrusion", The Visual Computer, Jan. 28, 2003, Springer-Verlag, pp. 38-49.

Stam, Jos et al. "Quad/Triangle Subdivision", Computer Graphics Forum, vol. 22, No. 1, Apr. 2003, pp. 79-85.

* cited by examiner

| 9:1 | 9:2 | 9:3 | 9:4 | 9:5 | 9:6 | 9:7 | 9:8 | 9:9 |
|---|---|---|---|---|---|---|---|---|
| 8:1 | 8:2 | 8:3 | 8:4 | 8:5 | 8:6 | 8:7 | 8:8 | 8:9 |
| 7:1 | 7:2 | 7:3 | 7:4 | 7:5 | 7:6 | 7:7 | 7:8 | 7:9 |
| 6:1 | 6:2 | 6:3 | 6:4 | 6:5 | 6:6 | 6:7 | 6:8 | 6:9 |
| 5:1 | 5:2 | 5:3 | 5:4 | 5:5 | 5:6 | 5:7 | 5:8 | 5:9 |
| 4:1 | 4:2 | 4:3 | 4:4 | 4:5 | 4:6 | 4:7 | 4:8 | 4:9 |
| 3:1<br>19 | 3:2<br>20 | 3:3<br>21 | 3:4<br>22 | 3:5<br>23 | 3:6<br>24 | 3:7<br>25 | 3:8<br>26 | 3:9<br>27 |
| 2:1<br>10 | 2:2<br>11 | 2:3<br>12 | 2:4<br>13 | 2:5<br>14 | 2:6<br>15 | 2:7<br>16 | 2:8<br>17 | 2:9<br>18 |
| 1:1<br>1 | 1:2<br>2 | 1:3<br>3 | 1:4<br>4 | 1:5<br>5 | 1:6<br>6 | 1:7<br>7 | 1:8<br>8 | 1:9<br>9 |

METHOD FOR DIGITAL MANUFACTURING OF JEWELRY ITEMS

CROSS REFERENCE TO RELATED APPLICATIONS

This application claims priority to U.S. Provisional Patent Application No. 61/308,245, filed on Feb. 25, 2010 the entire contents of which are incorporated herein by reference.

BACKGROUND

Introduction

Manufacture of jewelry can be done using a lost wax process. In such process, a plurality of wax patterns, also referred to herein as wax models, are formed, each representing a jewelry item to be manufactured. The wax patterns are aggregated to form a tree and the tree is placed in a flask. The flask is filled with investment (a plaster-like material) and the wax melted out to form a mold. The mold is filled with a metal alloy that forms the jewelry items. After the metal alloy hardens, it is removed form the mold and each jewelry item removed from the tree.

As a predicate to the lost wax process (also referred to as "lost wax burnout" and "lost wax investment" processes), a wax pattern must be made. Commonly, wax patterns have been made by forming a mold and then putting molten wax in the mold to harden to form the pattern. Forming wax patterns using a mold has inherent limitations. For example, the toolpath for the mold must have cuts that allow the wax pattern to pull away from the mold. Because of limitations in formation, the pattern cannot have undercuts, thin wires, filigree, beads, hollow areas, etc.

An alternative method for manufacturing a wax pattern is using a rapid prototyping (RP) process. In rapid prototyping, a digital image is converted into a physical product by printing layers of wax on a substrate using a solid wax modeling machine or other similar RP technology. The digital image may be a CAD (computer aided design) image. In the past, it has been difficult to apply rapid prototyping to mass produced personalized jewelry items such as class rings because automation software needed to meet production capacity requirements does not readily exist, level of detail requirements can not be met, and RP materials are typically polymer-based. Polymers do not perform as well as wax-like materials during the lost-wax burnout process.

BRIEF SUMMARY

In various embodiments, digital manufacturing of jewelry items is provided, including a physical process and software automation for implementing the physical process. Further, models formed during the process, as well as the resultant jewelry items, are provided. In some embodiments, the method comprises forming a digital model of the jewelry item, forming a physical model of the jewelry item based on the digital model, and manufacturing the jewelry item in a lost wax process using the physical model.

While multiple embodiments are disclosed, still other embodiments of the present invention will become apparent to those skilled in the art from the following detailed description. As will be apparent, the invention is capable of modifications in various obvious aspects, all without departing from the spirit and scope of the present invention. Accordingly, the detailed description is to be regarded as illustrative in nature and not restrictive.

DETAILED DESCRIPTION

In various embodiments, digital manufacturing of items, such as customized jewelry items, is provided, including a physical process and software automation for implementing the physical process. Further, models (also referred to herein as patterns) formed during the process, as well as the resultant items, are provided. It is to be appreciated that the digital manufacturing process may be used to manufacture other items or products.

Figure 1:
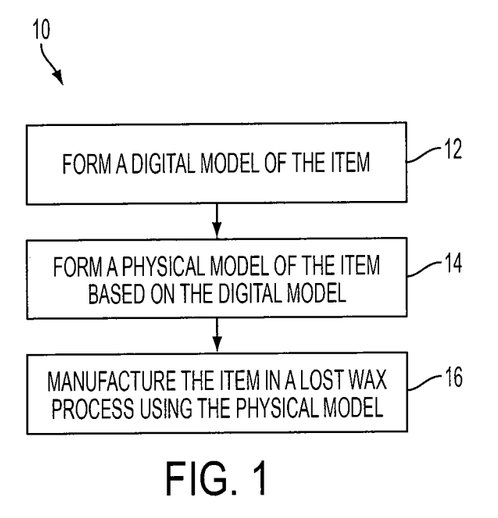
FIG. 1 illustrates a method for digital manufacturing of items, in accordance with one embodiment.

FIG. 1 illustrates one embodiment of a method 10 for digital manufacturing of items such as jewelry items. As shown, the method 10 comprises forming a digital model of a customized item [block 12], forming a physical model of the customized item based on the digital model [block 14], and manufacturing the customized item in a lost wax process using the physical model [block 16]. The physical model may alternatively be referred to as a physical pattern.

Forming the digital model of the item may include creating a 3D digital model of a generic item, creating digital representations of a plurality of customization components (referred to as digital models), and combining the 3D models of the generic item and the 3D digital models of the customization components to create a 3D model of the customized item. Because the digital models may be based on the same CAD (Computer Aided Design) data used for traditional manufacturing, creation of the 3D models may leverage existing production technology. The 3D models are typically represented as STL (STereoLithography) format, which is commonly used in the RP industry. STL formatted files describe the surface geometry of a three-dimensional object.

Creation of the digital models of the customization components may be done in a variety of ways. In one embodiment, the digital representation may be created by taking a plurality of CAD curves and surfaces, then using CAM (Computer Aided Machining) software to create a toolpath from those curves and surfaces, and finally computing the surface of the volume that would be removed by a cutting tool following that toolpath.

In another embodiment, the digital representation may be created directly from the CAD geometry. This comprises extracting a plurality of curves and surfaces from a CAD model, extruding them, and calculating the surface geometry of the volume created by that extrusion.

The digital models of the generic item and the customization components may be combined using several different boolean operations, most commonly the union, subtraction, and intersection operations.

Forming the physical model of the item based on the digital model [block 14] may comprise using a rapid prototyping process.

Manufacturing the item in a lost wax process using the physical model [block 16] then follows. Lost wax processes commonly known for forming rings may be used. The lost wax process used to form the physical item may include any suitable steps known or later developed. In one embodiment, a lost wax process as described in U.S. Pat. No. 3,964,915 may be used. The teachings of this patent are herein incorporated by reference.

Each of forming a digital model of the jewelry item and forming a physical model of the digital model will now be described in more detail.

Figure 2:
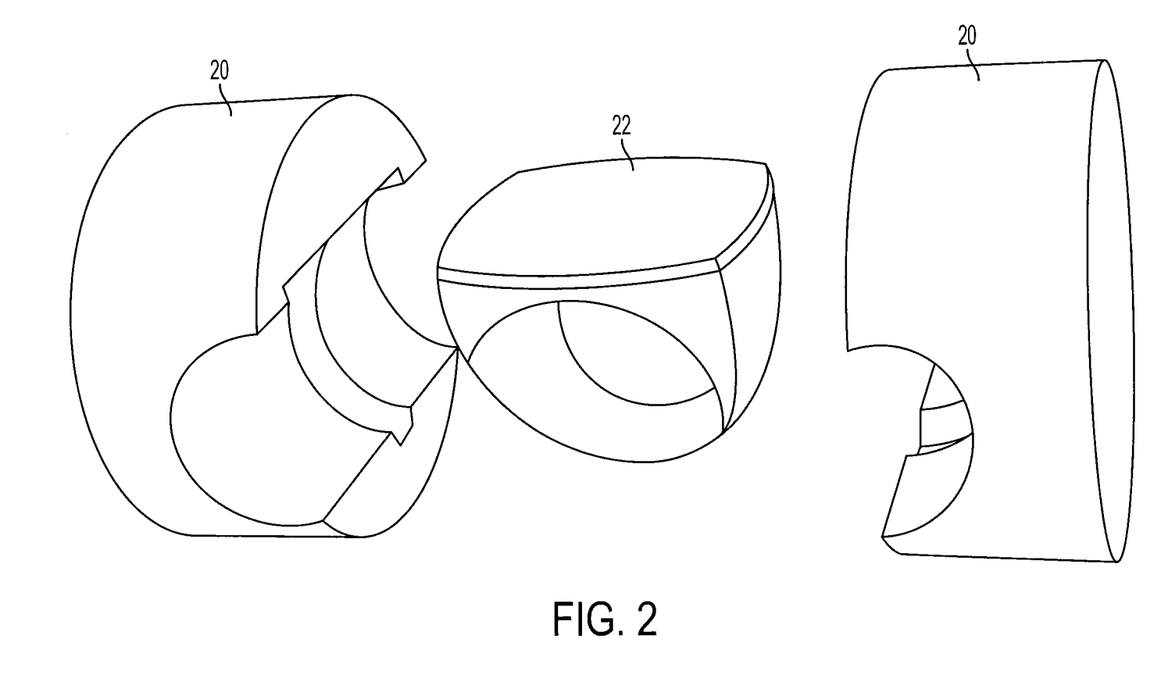
FIG. 2 illustrates a formed mold and an associated model for forming the mold.

FIG. 2 illustrates a formed mold 20 of a jewelry item and an associated model 22 for forming the mold. In current techniques for manufacturing a mold, a tool path is digitally created by which a block is cut by a tool to form the mold. When the tool path is used by a physical machine having a tool, the tool removes a portion of the block (the model) such that the remaining portion is the mold. The model substantially reflects the form of the intended jewelry item and can be used to manufacture a physical model. U.S. Pat. No. 7,069,108 describes one method for digitally creating a tool path and is herein incorporated by reference. As previously described, in one embodiment, a tool path may be used to create a digital model generally corresponding to a model for use with methods described herein.

Accordingly, in one embodiment, the process described herein leverages the current technology used for digitally creating a tool path to form a digital model of a customized jewelry item. More specifically, the digitally created tool path can be combined with a digital model of a generic (or stock), non-customized jewelry item using boolean operations to form a 3D digital model of the jewelry item. While discussion is specifically made to using the digital model for manufacturing an item such as a jewelry item, it is to be appreciated that the digital model may alternatively be used for other purposes. For example, the digital model may be used to create a high resolution image of a jewelry item for showcasing the customized jewelry item—such as for creating a poster of a custom championship ring—or may be used to create an illustration of a proposed jewelry item during design of a customized jewelry item.

Figure 3:
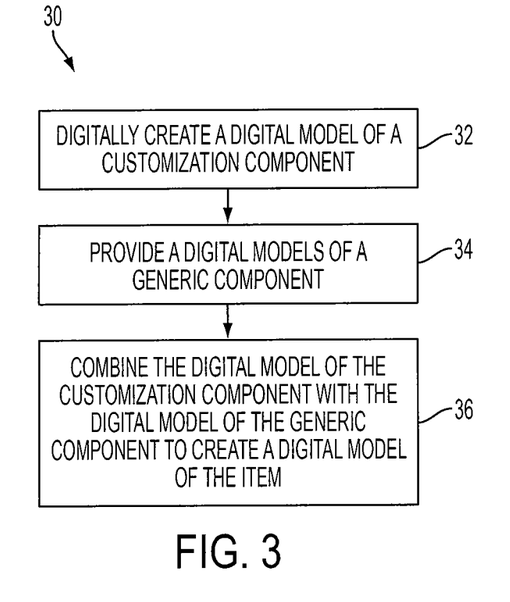
FIG. 3 illustrates a process for forming a digital model of an item, in accordance with one embodiment.

FIG. 3 illustrates an example of the process 30 for forming a digital model of the item. For the purposes of illustration, an item is described that is a jewelry item and, more particularly, is a customized class ring. Accordingly, in various portions herein, specific reference may be made to a class ring. Generally, digital 3D models of jewelry are either generic jewelry items, referred to as generic components, or customization components. Generic components may include, for example, the generic structure of the item, such as a ring shank of a class ring. A customization component is a customized item for combination with the generic component, such as a school mascot for placement on the ring shank, to form a customized item.

A generic component may be modeled in CAD and converted to STL format for use in digital manufacturing as provided herein. Custom components typically come from two sources: a tool path converted to STL and offset geometry stored in STL format, both described above. To form a digital model, generic components may be combined with customization components.

As shown in FIG. 3, a digital model of a customization component is digitally created [block 32]. It is to be appreciated that the digital model of the customization component may be a 3D digitial model. One or more 3D digital models of generic components, such as a stock class ring, is provided [block 34]. It is to be appreciated that one or a plurality of generic components and one or a plurality of customization components may be used in designing the customized item and that corresponding digital models—to each of or to a combination of—components may be formed.

In some embodiments, each of the digital models of generic components and the digital models of customization components are created in or converted to a format suitable for merging with other digital models, such as STL format. The digital model of the customization component [from block 32] (in some embodiments a converted tool path) is combined with the digital model of the generic component [from block 34] to form a digital model of the jewelry component [block 36].

Using current manufacturing technology, a tool path is physically applied to a block of material to form the mold. The mold is typically a generically sized ring such that the wax model is cut down or up to size after injection of material into the mold. In contrast, the process 30 for forming a digital model of the jewelry item may be used to create a sized digital item. This digital model is then converted into a physical model. Thus, the physical model may lead to a sized physical mold and the resultant manufactured jewelry item may be a sized jewelry item that does not require cutting down or up to resize. Accordingly, in some embodiments, a sized wax model is provided. In order to provide such sizing at the digital model stage, it may be useful to have stock 3D digital models of sized jewelry items such that the boolean operation combines the tool path with the sized jewelry item.

Figure 4:
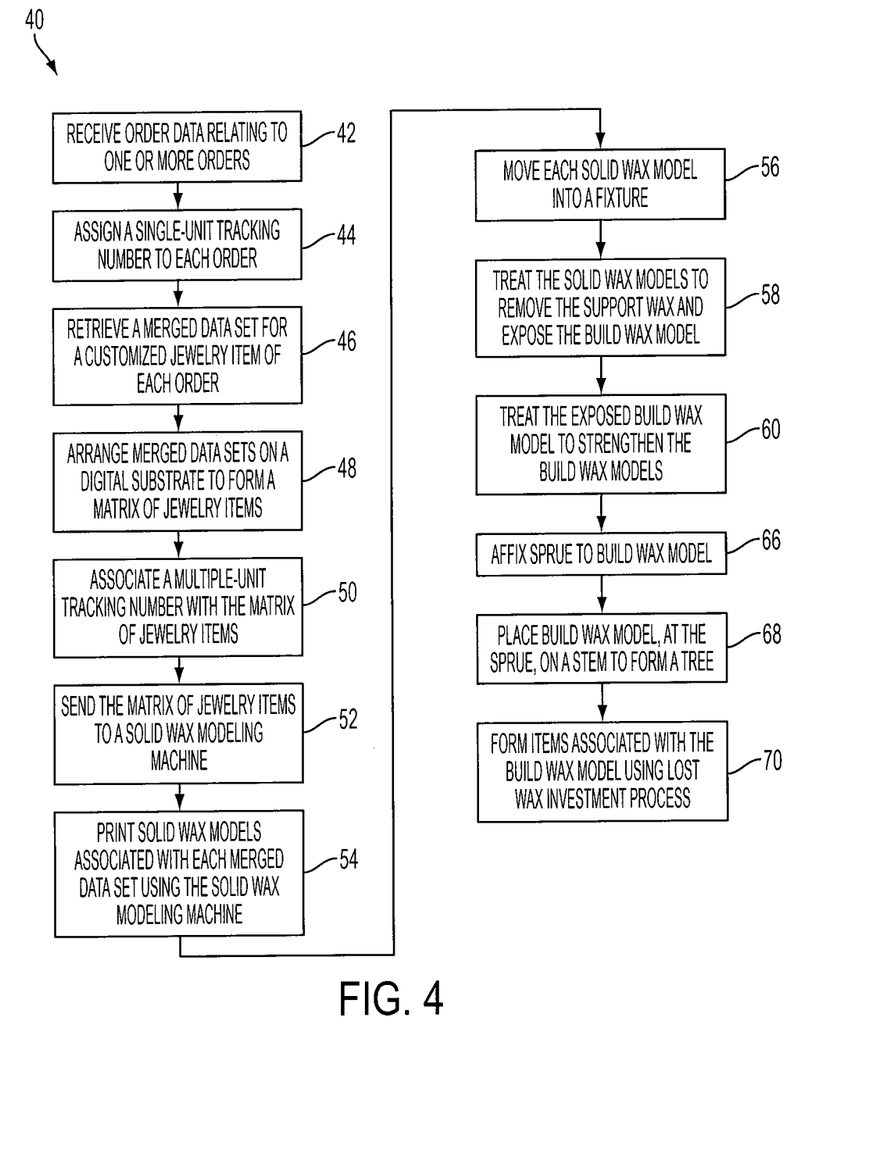
FIG. 4 illustrates a method for digital manufacturing of items, in accordance with one embodiment.

FIG. 4 illustrates a method 40 for digital manufacturing of items. More specifically, FIG. 4 illustrates a method 40 for mass production of customized jewelry items using digital means. One advantage of the method 40 described is the ability to track a plurality of items throughout the process.

As shown, order data is received [block 42]. In certain examples, that order data includes information relating to one or more customized jewelry items. The order data thus may comprise a plurality of orders, each associated with a single jewelry item. Each order is assigned a single-unit tracking number [block 44]. This single-unit tracking number may comprise a scannable bar code, a number associated with an RFID device, or other.

Figure 5:
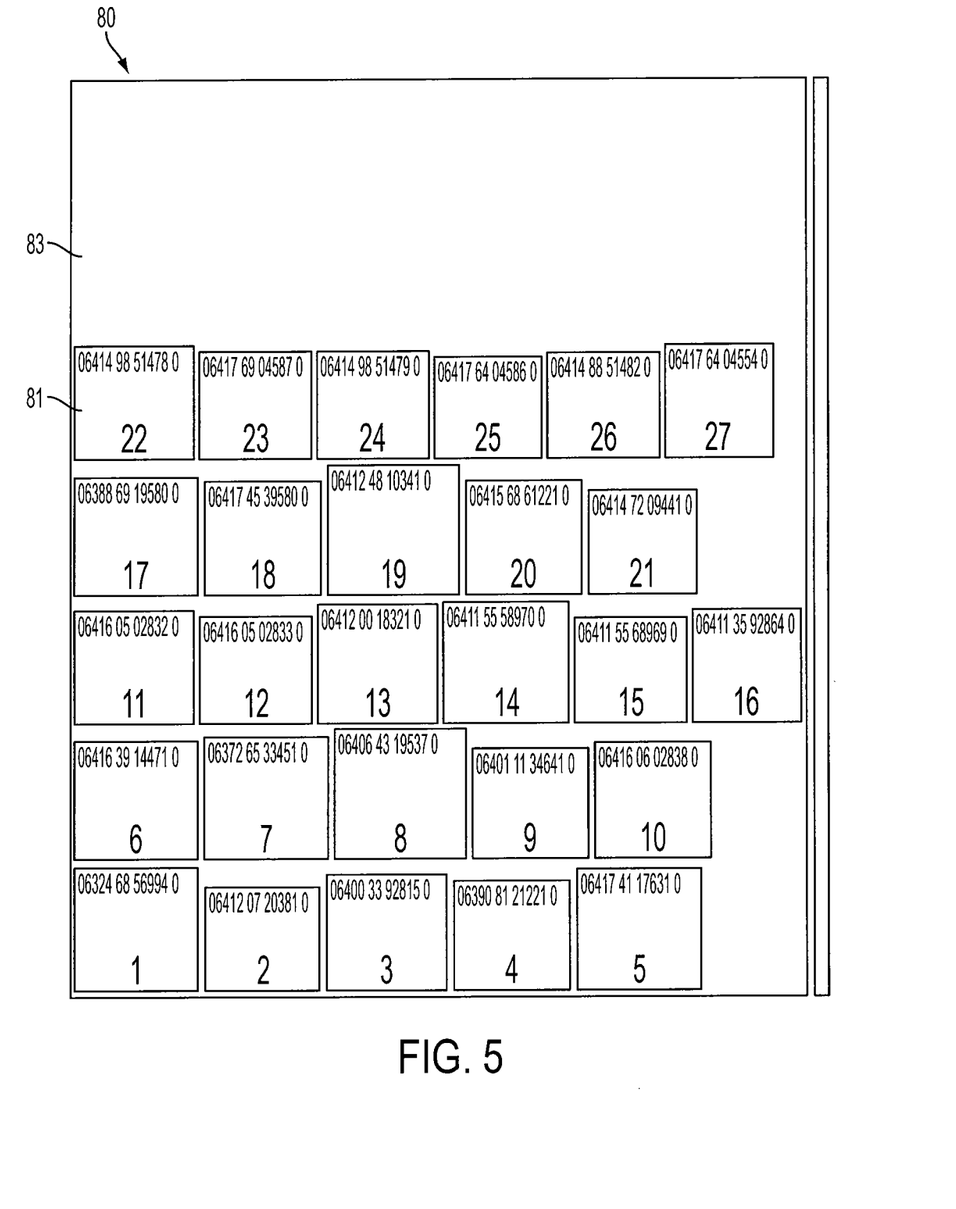
FIG. 5 illustrates a sample map showing placement of merged data sets, in accordance with one embodiment.

An operator enters the number for each order into a computer and the computer retrieves information relating to the customized jewelry item for that order. Specifically, a merged data set for a customized jewelry item of each order is retrieved [block 46]. Entering of the number may comprise scanning a bar code. The information relating to customized jewelry item may be referred to as a merged data set. The merged data sets are then arranged onto a digital substrate to form a matrix of jewelry items [block 48]. It is to be appreciated that while jewelry items are specifically referred to herein, any other suitable type of item may be manufactured using the disclosed process and the matrix thus may layout other types of items. The digital substrate represents a matrix of jewelry items that is used during the rapid prototyping process. Accordingly, the merged data sets (each representing a jewelry item) may be arranged on the digital substrate to maximize usage of the area of the substrate. The matrix of jewelry items is associated with a multiple-unit tracking number [block 50]. The multiple-unit tracking number may comprise a scannable bar code, a number associated with an RFID device, or other. The matrix of jewelry items may be printed on a sheet of paper to provide a map for an operator in the manufacturing process, the map showing a layout of the placement of each merged data set (represented by a single-unit tracking number) on the substrate. FIG. 5 illustrates a sample map 80 showing placement of merged data sets 81 on a digital substrate 83.

Returning now to FIG. 4, as the manufacturing process begins, the matrix of jewelry items is sent to the solid wax modeling machine [block 52]. A physical substrate, associated with the multiple-unit tracking number, is placed in the solid wax modeling machine. Association of the multiple-unit tracking number with the substrate may be done using a tag. Solid wax models, each associated with a merged data set, are then printed on the substrate by the solid wax modeling machine [block 54].

Figure 6:
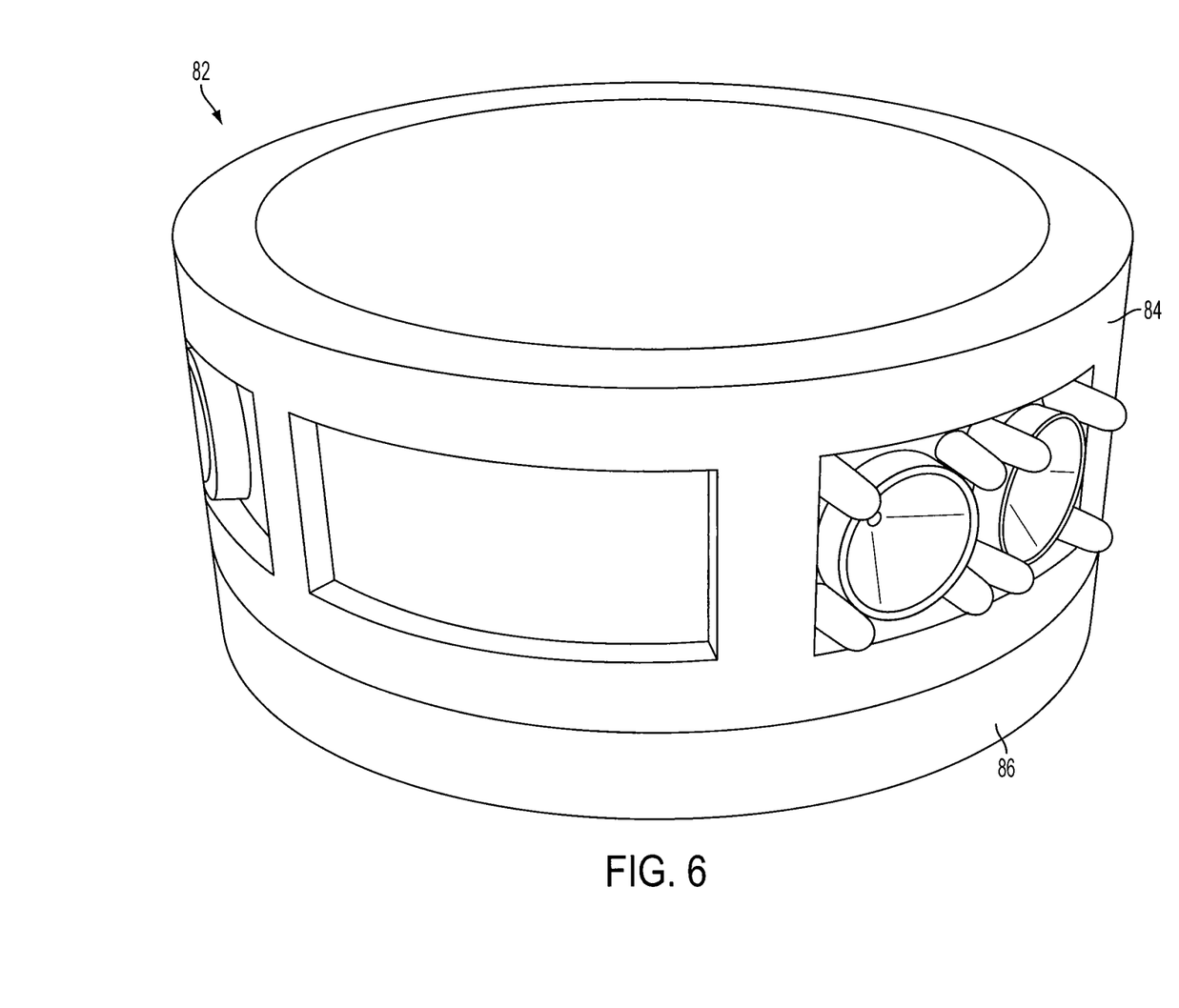
FIG. 6 illustrates a solid wax model comprising a build wax and a support wax, in accordance with one embodiment.

FIG. 6 illustrates a solid wax model 82 comprising a build wax model 84 and a support wax 86, the build wax representing the physical model for forming a jewelry item and the support wax supporting the model wax on the substrate. It is to be appreciated that, while FIG. 6 shows a solid wax model 82 with a hollow middle through the build wax model 84, in some embodiments, the hollow middle may be filled with support wax during printing. The solid wax models are printed on the substrate in a layout matching the layout of the map.

Figure 7:
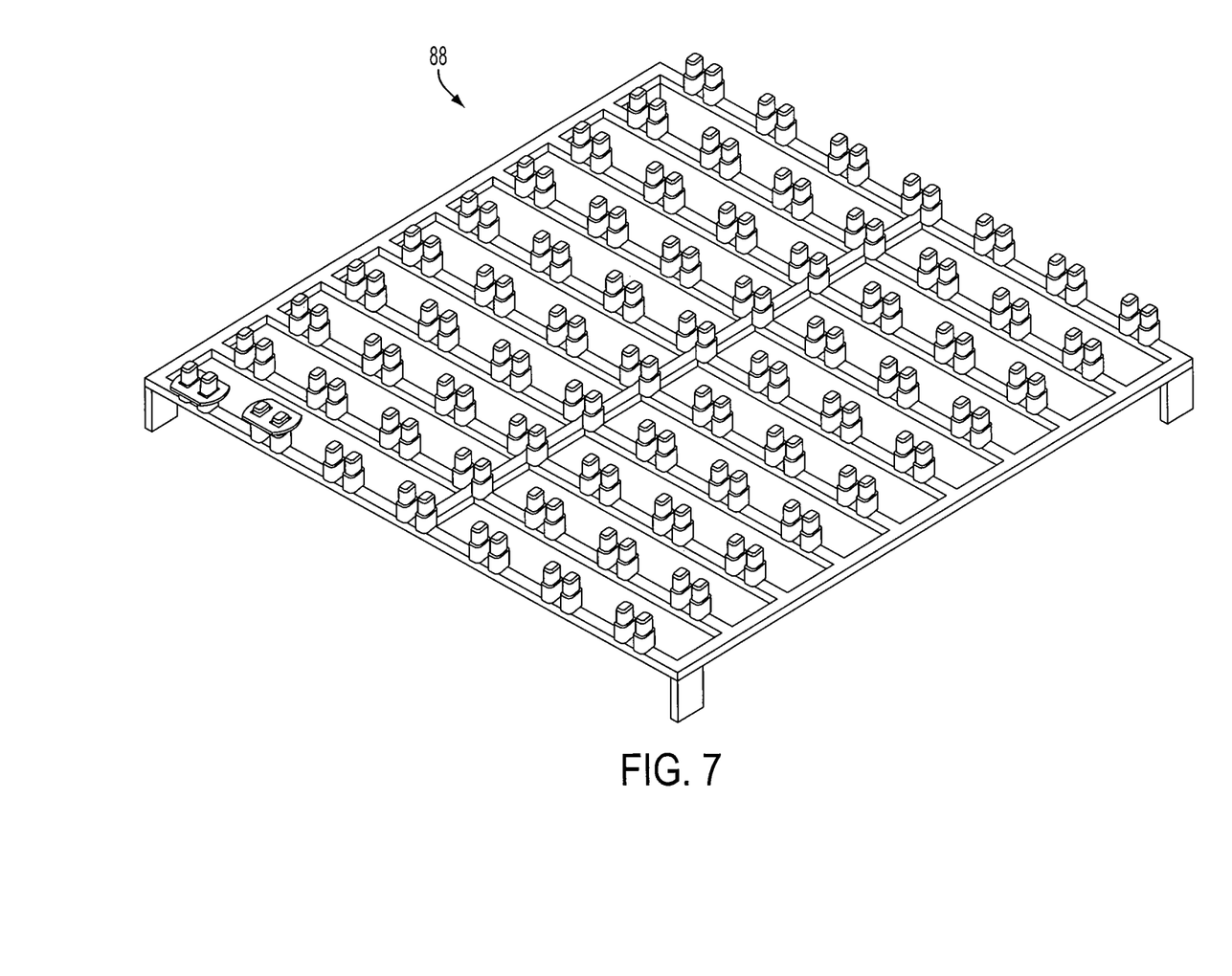
FIG. 7 illustrates a fixture suitable for receiving small items, in accordance with one embodiment.
Figure 8:
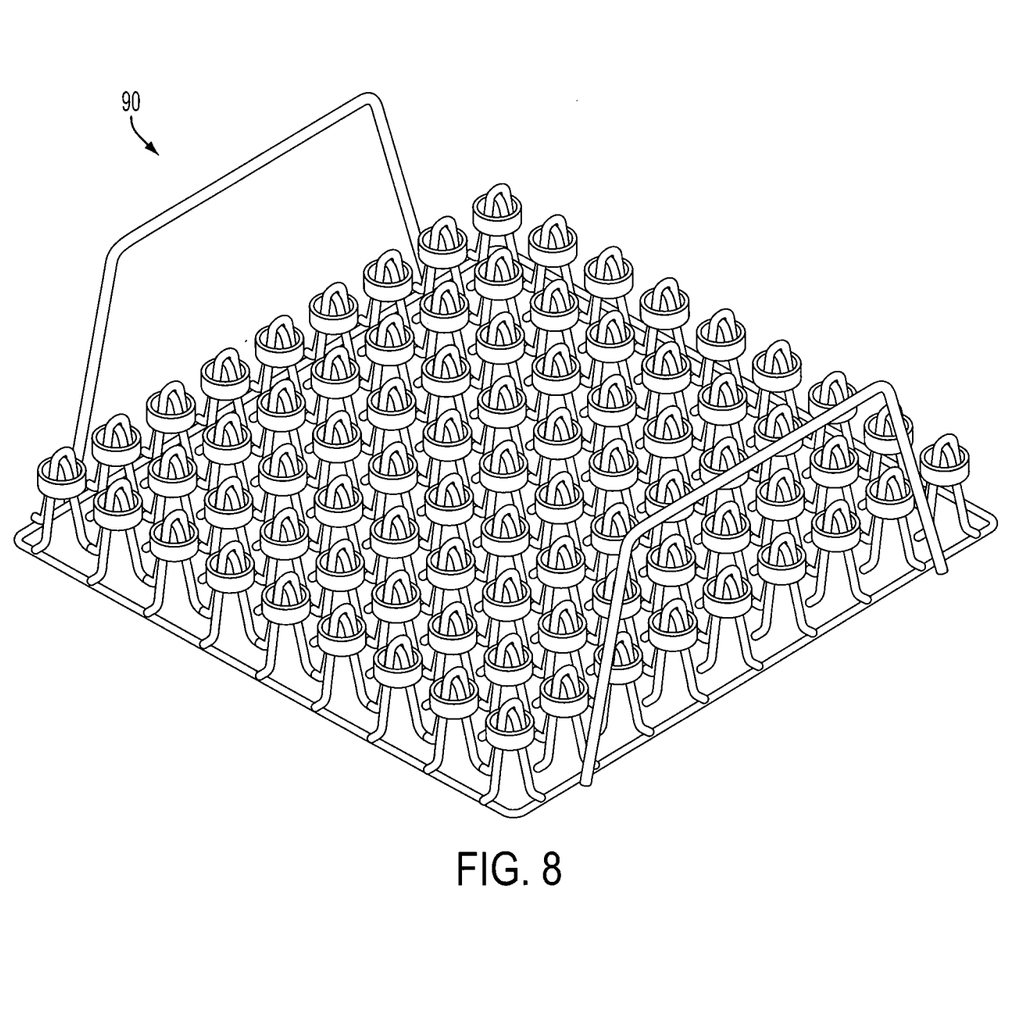
FIG. 8 illustrates a fixture suitable for receiving large items, in accordance with one embodiment.
Figure 9:
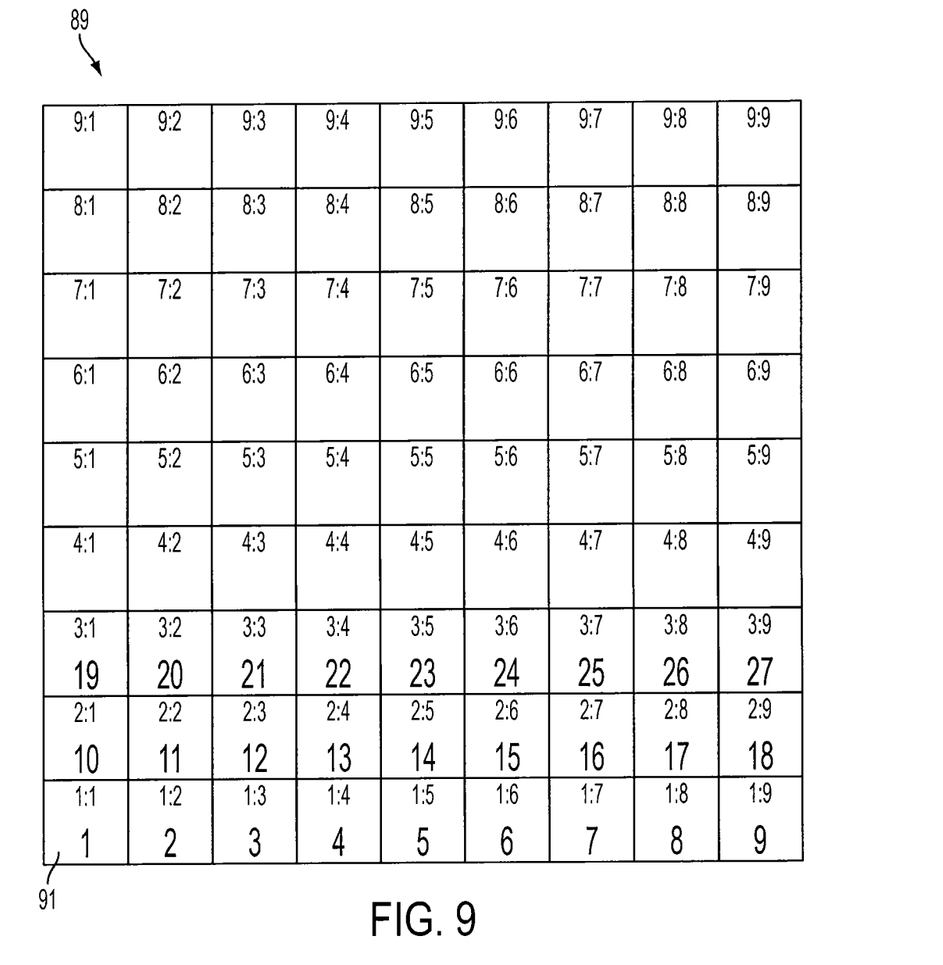
FIG. 9 illustrates a fixture map, in accordance with one embodiment.
Figure 10:
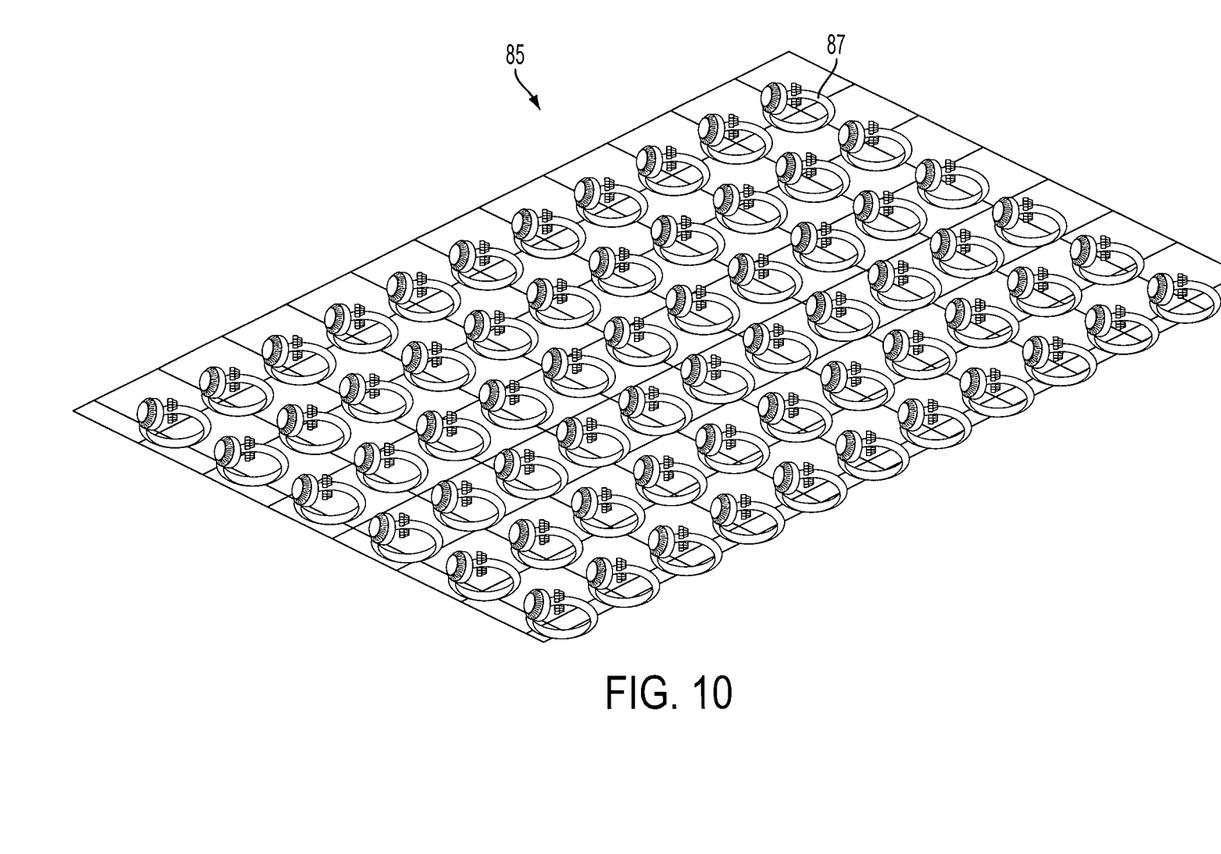
FIG. 10 illustrates a sample fixture showing placement of wax models in a position on the fixture corresponding to the position of corresponding merged data sets on the digital substrate of FIG. 5, in accordance with one embodiment;.

Returning to FIG. 4, each solid wax model is moved into a fixture [block 56]. The fixture is associated with the multiple-unit tracking number, for example, using a tag. The fixture may be configured such that the solid wax models may be placed in a manner substantially reflecting the placement of the models on the map. A variety of fixtures may be used having different sizes, different orientations, and other characteristics. FIG. 7 illustrates a fixture 88 suitable for receiving small items such as jewelry components. FIG. 8 illustrates a fixture 90 suitable for receiving large items such as jewelry items containing integrated components. FIG. 9 illustrates a fixture map 89. The fixture map 89 may be used to guide placement of the patterns formed on the substrate in positions as indicated by the map of FIG. 5 onto the fixture of FIG. 8. As shown, each position 81 in FIG. 5 is reflected by a corollary position 91 in FIG. 9. FIG. 10 illustrates a sample fixture 85, also referred to as a build tray, showing placement of wax models 87 in a position on the fixture 85 corresponding to the position of corresponding merged data sets on the digital substrate. A fixture map may be generated for each multiple unit tracking number.

Returning again to FIG. 4, the solid wax models are treated to remove the support wax and expose the build wax model [block 58]. In one embodiment, removing the support wax is done by placing the fixture in an ultrasonic tank having a solvent therein. The solvent acts to remove wax from wax. A suitable solvent thus is isopropyl alcohol based therein. In a specific embodiment, the fixture is placed in the ultrasonic tank for approximately 20 minutes. In another embodiment, a modified or standard vapor degreaser may be used. The solvent may be cleaned such that it may be reused during further implementations of the method. Alcohol is a solvent that is highly flammable so precautions generally must be taken in a production facility to minimize any associated risk. Other less flammable solvents may alternatively be used.

The exposed build wax can then be treated to strengthen the build wax models [block 60]. After treatment in a solvent to remove the support wax, the build wax may be weakened. One manner of treating the build wax to strengthen comprises placing the fixture in a tank holding alcohol and a wax additive. One suitable wax additive is a glass polymer. The fixture may be dipped, for example, for 20 second with the strength of the build wax being doubled.

Generally, during treatment of the wax models as shown in blocks 58 and 60, temperature of the liquids for receiving the wax may be kept at a temperature ranging from room temperature to approximately 130° F. It is to be appreciated that while specific discussion is made to placing fixtures holding the wax models in tanks for treatment, the wax models may alternatively be placed in the tank, such as by individual placement or dipping.

As discussed, the wax models may be used for manufacturing customized jewelry items using a lost wax process. For lost wax manufacturing, the wax models to be converted to jewelry items are aggregated to form a tree. In order to aggregate the patterns, each pattern includes a sprue that is affixed to a main spru to form the tree. The sprues are typically affixed to the wax model using a heat stake. Wax models formed using a rapid prototyping process may be temperature sensitive such that use of a heat stake on the wax model can be difficult. Accordingly, a sprue may be affixed to the wax model.

Figure 11:
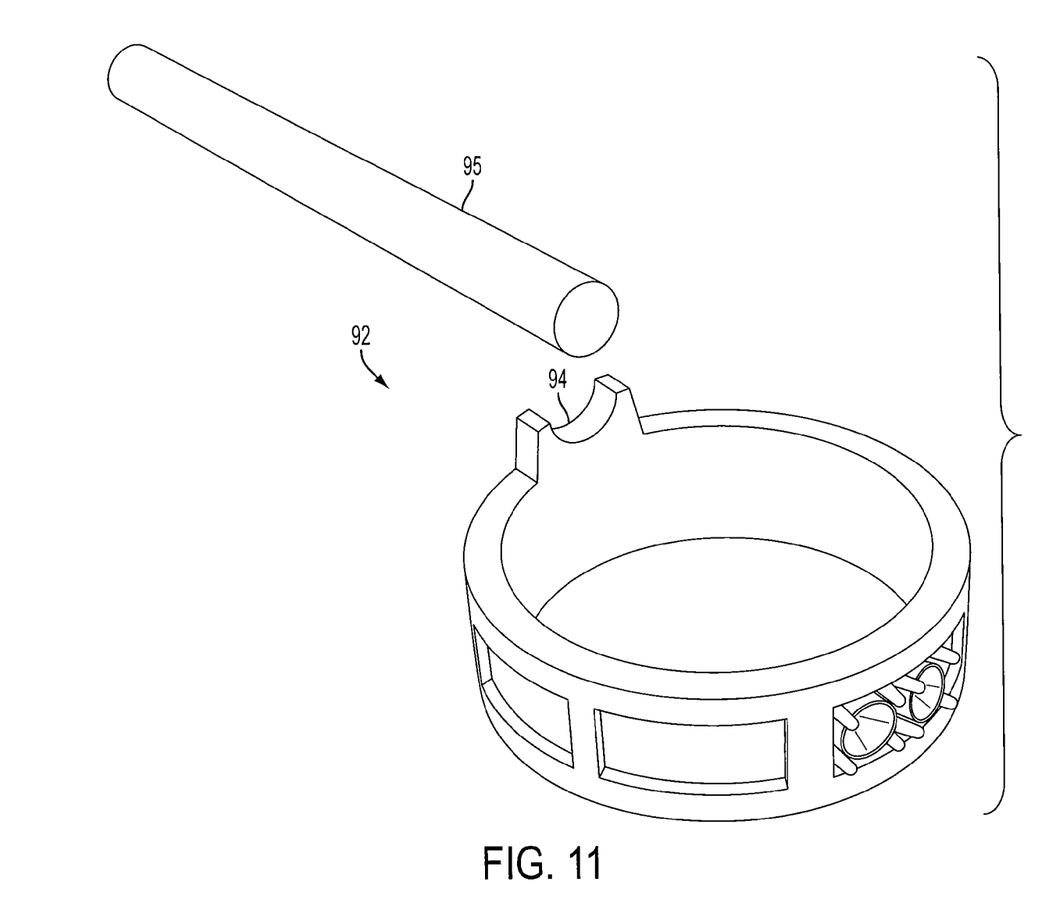
FIG. 11 illustrates a wax model having a design feature for receiving a sprue.

In some embodiments, the 3D digital model may include design features for receiving the sprue. Such design features may include concave features. Returning to FIG. 4, a sprue may be affixed to the build wax model [block 66]. FIG. 11 thus illustrates a wax model 92 having a design feature 94 for receiving a sprue 95.

After fixation of the sprue to each build wax model, the resultant physical structure comprises a fixture having an associated multiple-unit tracking number with build wax models placed thereon, each having an associated single-unit tracking number.

Each wax model is then placed on the main stem or sprue of a tree [block 68]. The tree is then used in a lost wax investment process to form a plurality of jewelry items [block 70]. It is to be appreciated that other mans for affixing the build wax models to the tree may be used and may not include affixing a sprue to the build wax model.

Accordingly, using the method herein described, customized items, and more particularly customized jewelry items, may be created in a mass production manner. The method is suitable for a high volume, mass customization environment and elements created during the method can withstand the rigor of a production facility. The jewelry items can have elements that that may be difficult to achieve using standard jewelry design and manufacture.

Although the invention has been described with reference to various embodiments, persons skilled in the art will recognize that changes may be made in form and detail without departing from the spirit and scope of the invention.

What is claimed is:
1. A method for digital manufacturing of a sized jewelry item comprising:
   forming a digital model of the sized jewelry item, the forming a digital model comprising:
      creating a three-dimensional digital model of a customization component by creating a toolpath based on

CAD data and computing a surface of a volume that would be removed by a cutting tool following the toolpath;

providing a three-dimensional digital model of a generic component by selecting a sized three-dimensional digital model of a generic component from a plurality of stock three-dimensional digital models of generic components; and combining the digital model of the customization component and the selected digital model of the generic component using a Boolean operation to form a three-dimensional digital model of the sized jewelry item;

forming a sized physical model of the sized jewelry item based on the digital model of the sized jewelry item; and manufacturing the sized jewelry item in a lost wax process using the physical model.

2. The method of claim 1, wherein the digital model of the customization component includes a format suitable for combining with other digital models.

3. The method of claim 2, wherein the format is STL.

4. The method of claim 1, wherein creating a digital model of a customization component comprises taking a plurality of CAD curves and surfaces, creating a toolpath from the plurality of CAD curves and surfaces wherein the toolpath removes a volume from a base piece, and computing a surface of the volume to be removed by a cutting tool following the toolpath.

5. The method of claim 4, wherein creating a toolpath is done using CAM software.

6. The method of claim 1, wherein creating a digital model of a customization component comprises extracting a plurality of curves and surface from a CAD model, extruding the plurality of curves and surfaces to create a volume, and calculating a surface geometry of the volume.

7. The method of claim 1 wherein forming a physical model of the jewelry item comprises printing a solid wax model including a build wax model and support wax, and treating the solid wax model to remove the support wax and expose the build wax model.

8. The method of claim 7, further comprising treating the build wax model to strengthen the build wax.

9. The method of claim 1, wherein the jewelry item is a class ring.

10. The method of claim 9, wherein the generic component is a ring shank.

11. A method for digital manufacturing of a jewelry item comprising:

forming a digital model of the jewelry item, the forming a digital model comprising:

creating a three-dimensional digital model of a customization component by creating a toolpath based on CAD data and computing a surface of a volume that would be removed by a cutting tool following the toolpath;

providing a three-dimensional digital model of a generic component; and combining the digital model of the customization component and the digital model of the generic component using a Boolean operation to form a three-dimensional digital model of the jewelry item; and manufacturing the jewelry item based on the three-dimensional digital model of the jewelry item using a rapid prototyping process.

* * * * *